US011778918B2

(12) United States Patent
Shen et al.

(10) Patent No.: US 11,778,918 B2
(45) Date of Patent: Oct. 3, 2023

(54) MAGNETIC MEMORY CELL WITH LOW-RESISTIVE ELECTRODE VIA AND METHOD OF FORMING SAME

(71) Applicant: Taiwan Semiconductor Manufacturing Co., Ltd., Hsin-Chu (TW)

(72) Inventors: Hsiang-Ku Shen, Hsinchu (TW); Liang-Wei Wang, Hsinchu (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 265 days.

(21) Appl. No.: 16/998,911

(22) Filed: Aug. 20, 2020

(65) Prior Publication Data

US 2022/0059759 A1    Feb. 24, 2022

(51) Int. Cl.
  *H10N 50/01*   (2023.01)
  *G11C 11/16*   (2006.01)
  *H10B 61/00*   (2023.01)
  *H10N 50/10*   (2023.01)
  *H10N 50/80*   (2023.01)
  *H10N 50/85*   (2023.01)

(52) U.S. Cl.
  CPC ........... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
  CPC ....... H01L 43/12; H01L 27/222; H01L 43/02; H01L 43/08; H01L 43/10; G11C 11/161; H10N 50/01; H10N 50/80; H10N 50/85; H10N 50/10; H10B 61/00
  USPC ......................................................... 257/421
  See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 10,763,304 B2* | 9/2020 | Hsu .......... | H01L 43/02 |
| 2017/0084820 A1* | 3/2017 | Tan .......... | H01L 43/12 |
| 2017/0092693 A1* | 3/2017 | Tan .......... | H01L 43/12 |
| 2018/0351091 A1* | 12/2018 | Chuang ................ | H01L 27/228 |
| 2018/0374895 A1* | 12/2018 | Hsu .......... | H01L 43/12 |
| 2022/0059759 A1* | 2/2022 | Shen ....................... | H01L 43/08 |

* cited by examiner

*Primary Examiner* — Jami Valentine Miller
(74) *Attorney, Agent, or Firm* — HAYNES AND BOONE, LLP

(57) ABSTRACT

A method for manufacturing a memory device includes forming a via trench in a substrate and forming a via in the via trench. A lower portion of the via includes a first metal and an upper portion of the via includes a second metal that is different from the first metal. The method further includes forming a magnetic tunneling junction over the via and forming a top electrode over the magnetic tunneling junction.

20 Claims, 20 Drawing Sheets

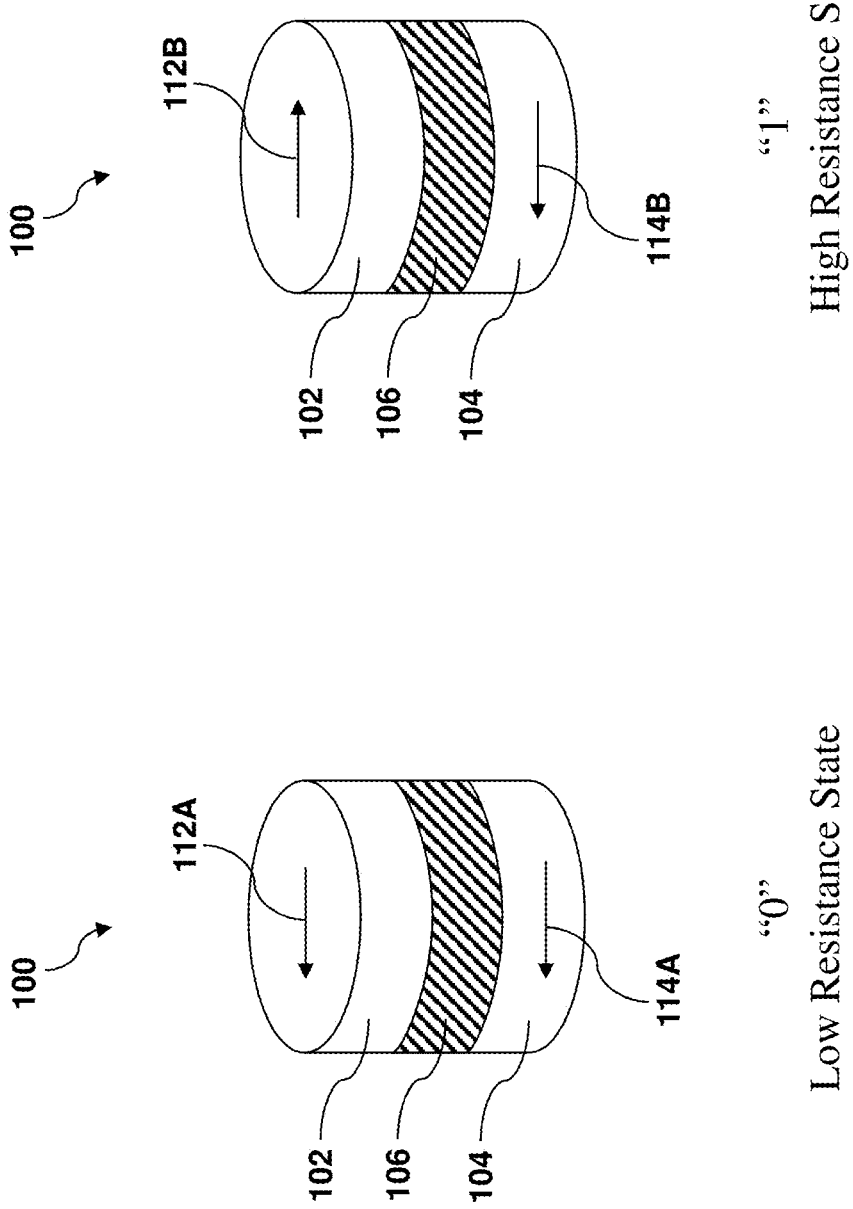

MAGNETIC MEMORY CELL WITH LOW-RESISTIVE ELECTRODE VIA AND METHOD OF FORMING SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and in particular to magnetic random-access memory (MRAM). MRAM offers comparable performance to volatile static random-access memory (SRAM) and comparable density with lower power consumption to volatile dynamic random access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier, and operates by tunneling of electrons between the two ferromagnetic layers through the insulating barrier. In operation, the variable states (e.g., logical "0" or "1" state) of an MRAM cell is typically read by measuring the resistance of the MTJ. Due to magnetic tunnel effect, the resistance of the MTJ changes with the variable magnetic polarity. When a voltage bias is applied across a combined structure of a top metal line (e.g., a bit line), a top electrode via, a top electrode, a MTJ, a bottom electrode, a bottom electrode via, and a bottom metal line (e.g., a word line), one can obtain a series resistance of the combined structure when a current flowing therethrough is measured. The series resistance includes the resistance of the MTJ and additional resistance. The additional resistance shall be reduced to or kept at a desirable value as low as possible in order to improve sensitivity and speed of the MRAM cell. Although existing approaches in MRAM device formation have generally been adequate for their intended purposes, they have not been entirely satisfactory in all respects. For example, a high-resistive bottom electrode via (BEVA) is often a major contributor to the additional resistance in an MRAM cell and thus degrades memory circuit performance. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B illustrate perspective views of a magnetic tunneling junction (MTJ) within a magnetic random-access memory (MRAM) cell.

DETAILED DESCRIPTION

Figure 1C:
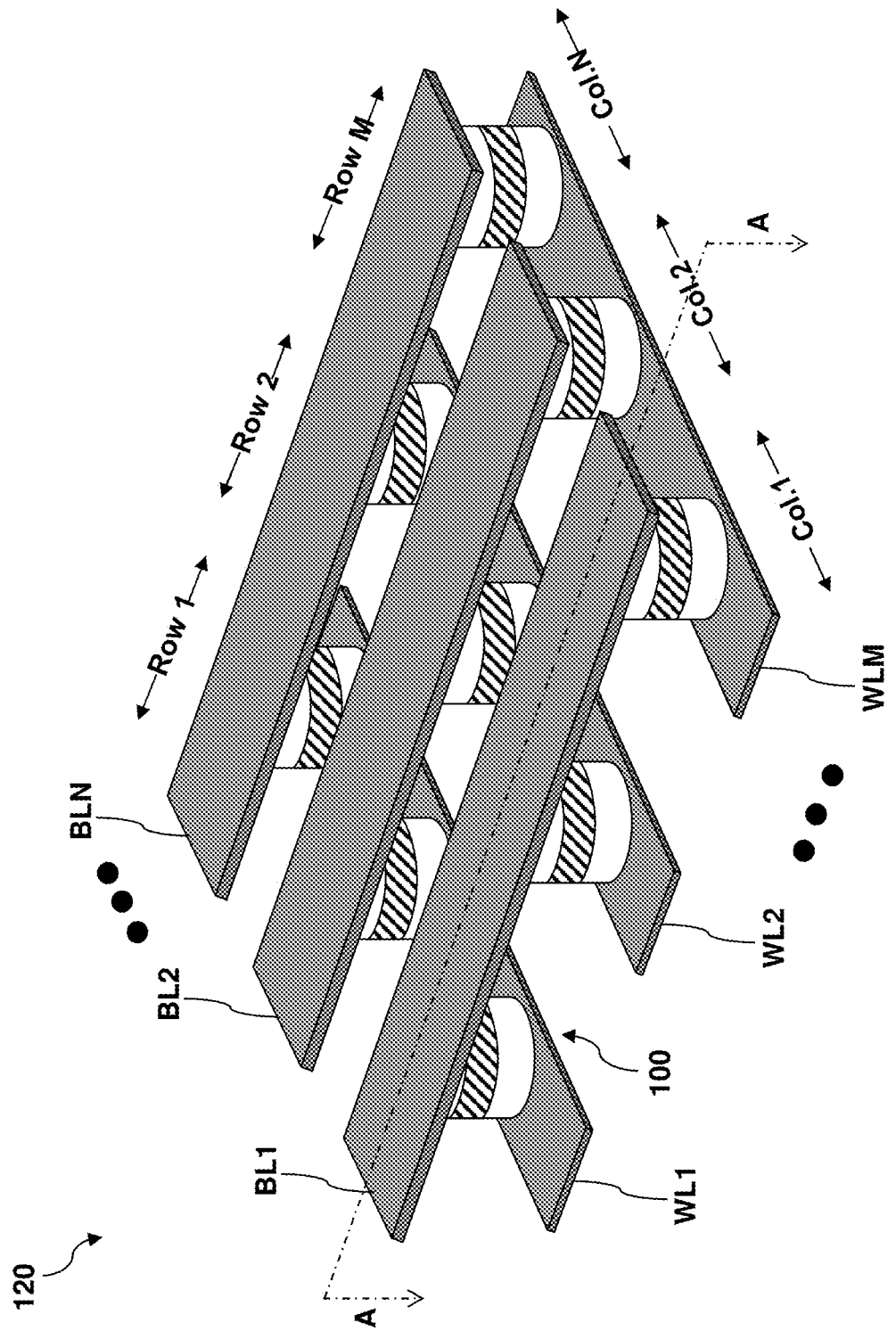
FIG. 1C illustrates an MRAM cell array, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. Some aspects of the present disclosure relate to magnetic random-access memory (MRAM) cells. More particularly, the present disclosure is related to providing an MRAM cell with a bottom electrode via (BEVA) comprising at least two different metals (e.g., copper and tungsten), which reduces additional resistance in a current path through the MRAM cell. By having a low-resistive current path, sensitivity and speed of the MRAM cell are improved.

FIGS. 1A and 1B illustrate perspective views of a magnetic tunneling junction (MTJ) 100 within an MRAM cell. The MTJ 100 includes an upper ferromagnetic plate 102 and a lower ferromagnetic plate 104, which are separated by a thin insulating layer 106, also referred to as a tunnel barrier layer. One of the two ferromagnetic plates (e.g., the lower ferromagnetic plate 104) is a magnetic layer that is pinned to an antiferromagnetic layer, while the other ferromagnetic plate (e.g., the upper ferromagnetic plate 102) is a "free" magnetic layer that can have its magnetic field changed to one of two or more values to store one of two or more corresponding data states.

The MTJ 100 uses tunnel magnetoresistance (TMR) to store magnetic fields on the upper and lower ferromagnetic plates 102 and 104. For sufficiently thin insulating layer 106 thicknesses (e.g., about 100 angstrom (A) or less), electrons can tunnel from the upper ferromagnetic plate 102 to the lower ferromagnetic plate 104. Data may be written to the cell in a variety of ways. In one method, current is passed between the upper and lower ferromagnetic plates 102 and 104, which induces a magnetic field stored in the free magnetic layer (e.g., the upper ferromagnetic plate 102). In another method, spin-transfer-torque (STT) is utilized, wherein a spin-aligned or polarized electron flow is used to change the magnetic field within the free magnetic layer with respect to the pinned magnetic layer. Other methods to write data may be used. Nonetheless, various data writing methods include changing the magnetic field within a free magnetic layer with respect to a pinned magnetic layer.

The resistance of the MTJ 100 changes in accordance with the magnetic fields stored in the upper and lower ferromagnetic plates 102 and 104, due to the magnetic tunnel effect. For example, in FIG. 1A, the magnetic fields of the upper and lower ferromagnetic plates 102 and 104 are aligned (e.g., arrows 112A and 114A), resulting in a low-resistance state (i.e., a logical "0" state). In FIG. 1B, a current has been passed through the MTJ 100 to induce a change in the magnetic field of the magnetic free layer (e.g., upper ferromagnetic plate 102). Therefore, after this data write operation, the magnetic fields in the upper and lower ferromagnetic plates 102 and 104 oppose one another (e.g., arrows 112B and 114B), which gives rise to a high resistance state (i.e., a logical "1" state). Hence, by measuring the resistance between the upper and lower ferromagnetic plates 102 and 104, read circuitry coupled to the MTJ 100 can discern between "0" and "1" data states.

FIG. 1C illustrates an MRAM cell array 120, which includes M rows (words) and N columns (bits) of MRAM cells. Each MRAM cell comprises an MTJ 100. Word lines $WL_1$, $WL_2$, . . . $WL_M$ extend across respective rows of memory cells and bit lines $BL_1$, $BL_2$, . . . $BL_N$ extend along columns. The MRAM cells are sandwiched between the metal grids of word lines and bit lines. Each MRAM cell further includes a top electrode connected to a metal line above (e.g., a bit line) through a top electrode via and a bottom electrode connected to a metal line under (e.g., a word line) through a bottom electrode via. When data is written to or read from a MRAM cell, a word line (WL) is asserted to select a row and an appropriate bias is applied to an individual bit line (BL) to write or read respective value to or from the respective MRAM cell of the selected row. Driven by the appropriate bias, a current flowing through a combined structure of the bit line, the top electrode via, the top electrode, the MTJ, the bottom electrode, the bottom electrode via, and the word line is measured. One can thus obtain a series resistance of the combined structure from values of the bias and current and derive the resistance of the MTJ. Accordingly, additional resistance other than the resistance of the MTJ itself shall be reduced to or kept at a desirable value as low as possible to safeguard sensitivity and speed of the MRAM cell. There is, however, a large portion of additional resistance to be expected due to the bottom electrode via. In some embodiments, titanium nitride (TiN) and tungsten (W) are widely used for forming the bottom electrode via. Although copper (Cu) has a much lower resistivity than TiN and W, process flows in the art avoid using Cu for the bottom electrode via, due to its high diffusion capability, which can be detrimental to the MTJ disposed above the bottom electrode via if diffusion occurs.

The present disclosure provides a method for fabricating MRAM cells with low-resistive copper-containing bottom electrode vias. As a result, sensitivity and speed of the MRAM cells are improved.

Figure 2A:
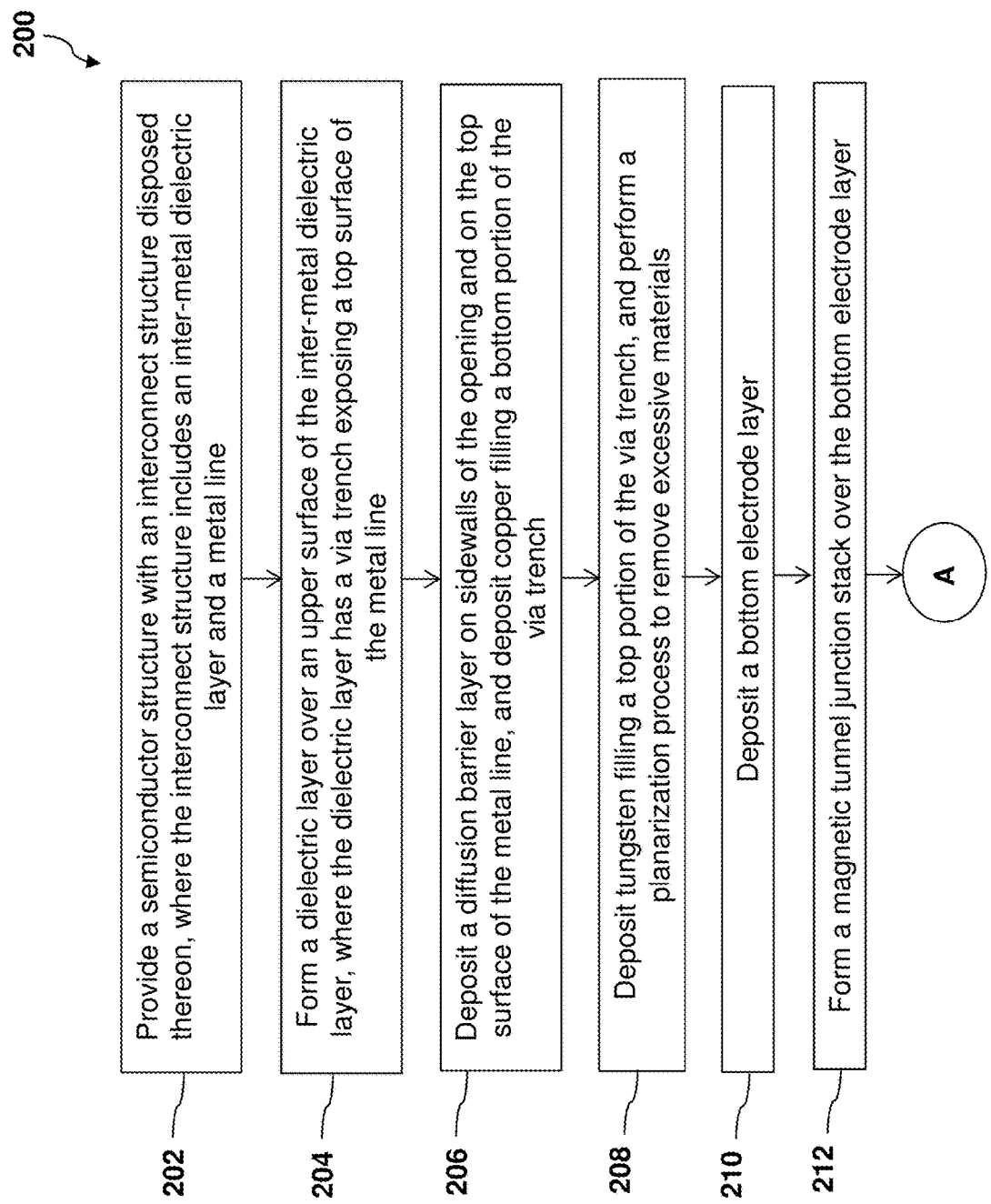
FIGS. 2A and 2B show a flow chart of a method for forming an MRAM cell array, according to aspects of the present disclosure.
Figure 2B:
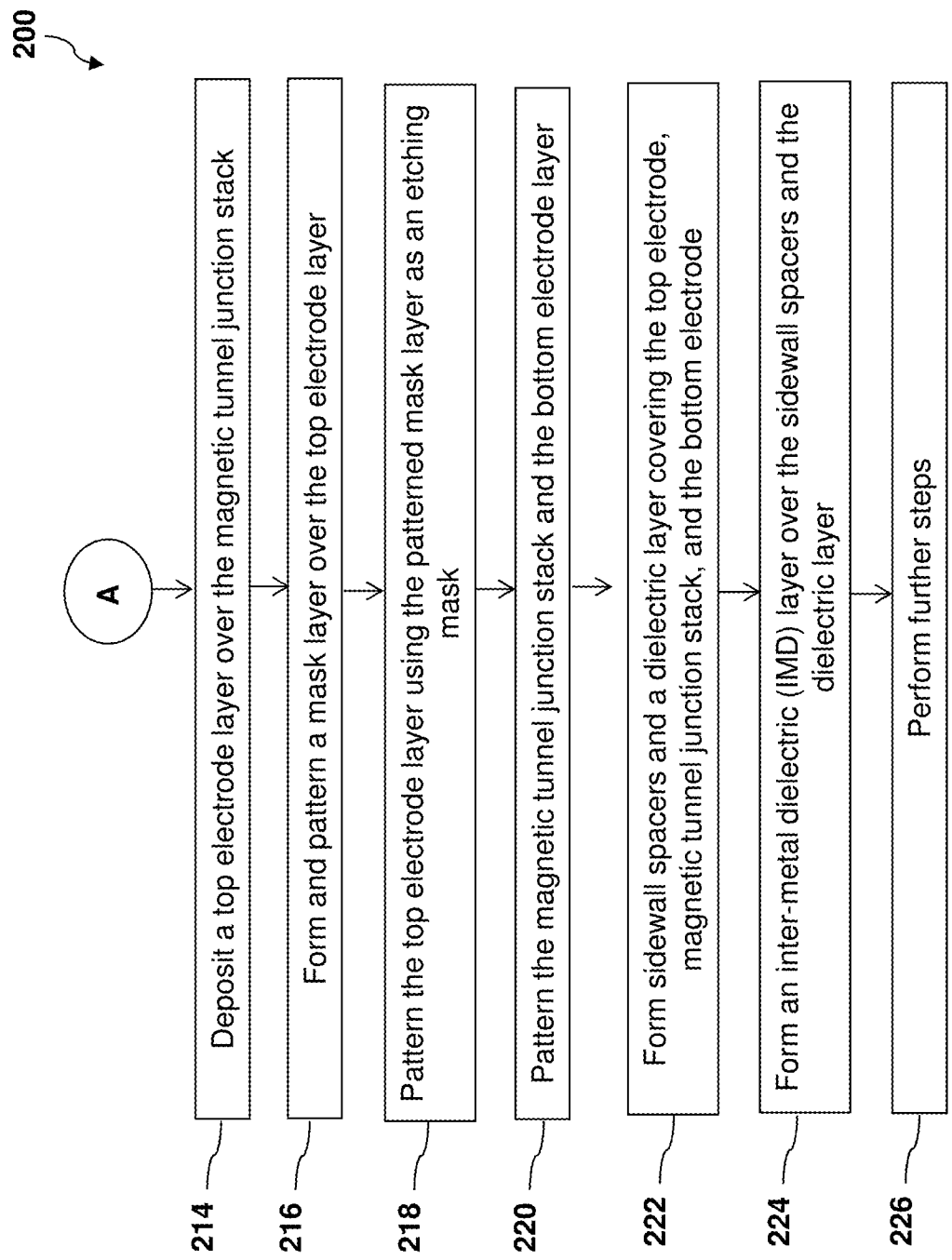

FIGS. 2A and 2B illustrate a flow chart of a method 200 for forming an MRAM cell array in accordance with an embodiment. The method 200 is merely an example, not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-18, which illustrate various cross-sectional views of a portion of an MRAM cell array during fabrication steps according to the method 200.

Figure 3:
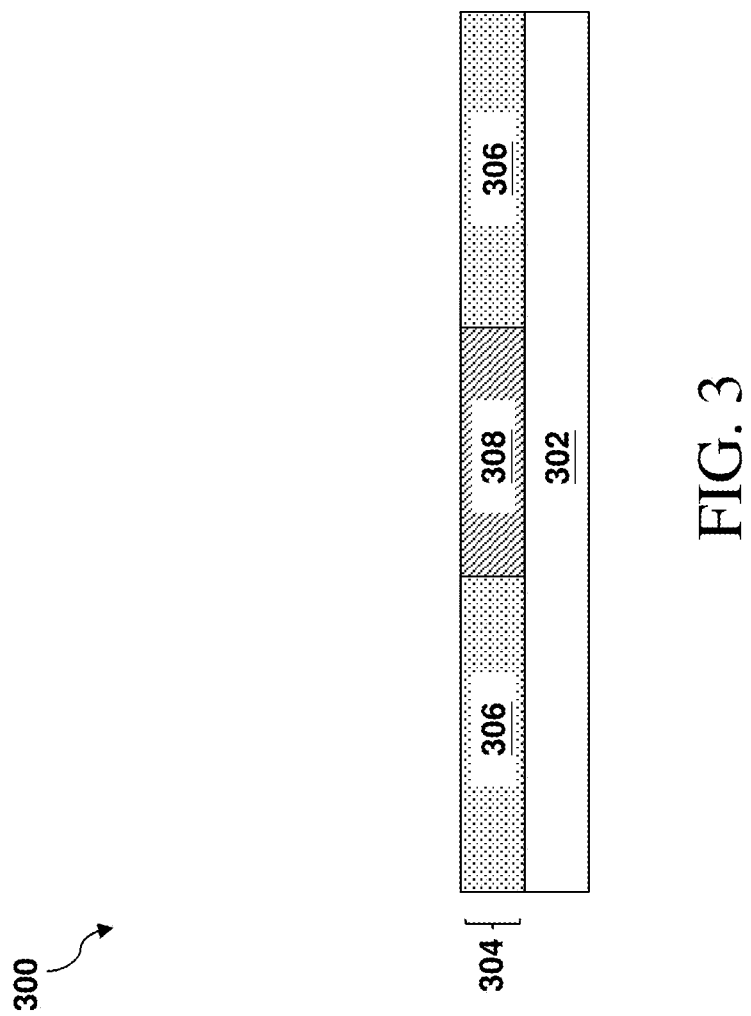
FIGS. 3, 4, 5, 6, 7, 8, 9, 10, 11, 12, 13, 14, 15, 16, 17, and 18 illustrate cross-sectional views of a semiconductor structure during a fabrication process according to the method of FIGS. 2A-2B, in accordance with some embodiments.

At operation 202, the method 200 (FIG. 2A) provides, or is provided with, a device structure 300 having a substrate 302, such as shown in FIG. 3. The substrate 302 is a silicon substrate in the illustrated embodiment. Alternatively, the substrate 302 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 302 includes indium tin oxide (ITO) glass. In various embodiments, the substrate 302 is a wafer, such as a silicon wafer, and may include one or more epitaxially grown semiconductor layers in its upper portion.

The substrate 302 is disposed with an interconnect structure 304 on its upper surface. The interconnect structure 304 includes an inter-metal dielectric (IMD) layer 306 and a metal line 308 which extends horizontally in the IMD layer 306. The IMD layer 306 can be an oxide, such as silicon dioxide, a low-k dielectric material such as carbon doped oxides, or an extreme low-k dielectric material such as porous carbon doped silicon dioxide. The metal line 308 can be made of a metal, such as aluminum (Al), Cu, or combinations thereof.

Figure 4:
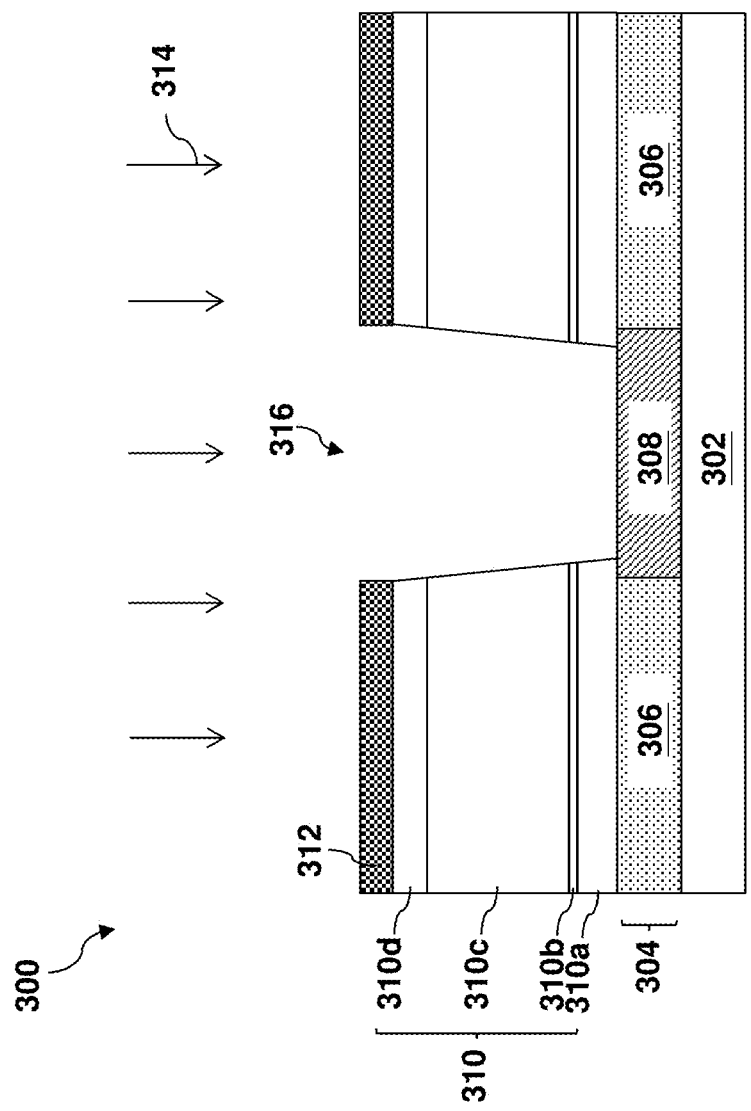

At operation 204, the method 200 (FIG. 2A) deposits a dielectric layer 310 over the interconnect structure 304, such as shown in FIG. 4. In the illustrated embodiment, the dielectric layer 310 is in a form of stacking sublayers, for example, a silicon carbonitride (SiCN) layer 310a, an aluminum oxide ($AlO_x$) layer 310b, an undoped silicon oxide glass (USG) layer 310c, and a capping layer 310d, which are blanket deposited over a top surface of the interconnect structure 304. The capping layer 310d is nitrogen free and comprises materials such as silicon-rich oxide (SRO), silicon oxycarbide, the like, or a combination thereof. The capping layer 310d is also used as a bottom anti-reflective coating (BARC) in some embodiments. Therefore, the capping layer 310d is also referred to as nitrogen-free anti-reflection coating (NFARC) layer. The dielectric layer 310 can be formed by a variety of techniques, including chemical vapor deposition (CVD), low-pressure CVD (LP-CVD), plasma-enhanced CVD (PE-CVD), sputtering, and physical vapor deposition (PVD), and the like. In some embodiments, the SiCN layer 310a has a thickness about 150-200 Å, the $AlO_x$ layer 310b has a thickness about 40-60 Å, the USG layer 310c has a thickness about 500-650 Å, and the NFARC layer 310d has a thickness about 200-1500 Å.

After the dielectric layer 310 is formed, a mask 312, such as a photoresist mask, is then formed over the dielectric layer 310. An etching process 314 is then carried out with the mask 312 in place to pattern the dielectric layer 310. The etching process 314 can be performed by a suitable dry etch operation. In some embodiments, the dry etch includes reactive ion etch (RIE) adopting fluorine-containing gases. In some embodiments, the dry etch operation can be any suitable dielectric etch to form a via trench 316 in a metallization structure of conventional CMOS technology. The via trench 316 exposes a portion of the metal line 308. The mask 312 can be removed after the etching.

Figure 5:
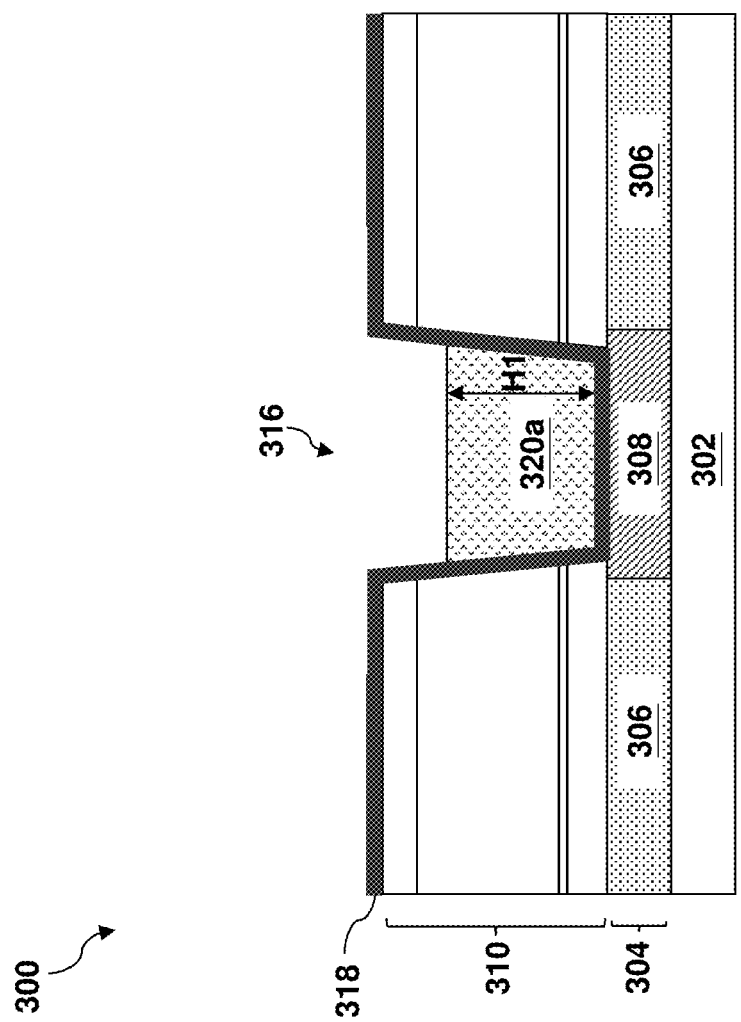

At operation 206, the method 200 (FIG. 2A) forms a diffusion barrier layer 318 that is blanket lined over sidewalls and bottom of the via trench 316 and over the dielectric layer 310. The diffusion barrier layer 318 may comprise a conductive material, such as, for example, titanium (Ti), titanium nitride (TiN), tantalum (Ta), tantalum nitride (TaN), cobalt (Co), or a combination of one or more of the foregoing. The diffusion barrier layer 318 may be deposited through a process such as atomic layer deposition (ALD), CVD, PVD or other suitable methods. For example, the diffusion barrier layer 318 may include three sublayers and be formed by sequentially depositing a tantalum layer (e.g., about 10 Å), a tantalum nitride layer (e.g., about 20 Å), and a cobalt layer (e.g., about 20 Å) in PVD processes at a temperature above 300 degrees in Celsius. Subsequently, a first deposition of bottom electrode via material 320a is performed. The bottom electrode via material 320a be deposited over the diffusion barrier layer 318 in the via trench 316. The resultant structure is illustrated in FIG. 5. The first deposited bottom electrode via material 320a may be formed by a variety of techniques, such as high-density ionized metal plasma (IMP) deposition, high-density inductively coupled plasma (ICP) deposition, sputtering, CVD, PVD, LP-CVD, PE-CVD, and the like. In the illustrated embodiment, the first deposited bottom electrode via material 320a is Cu and is formed of an electroplating operation with a Cu seed layer deposited over the diffusion barrier layer 318 in the via trench 316. The electroplating operation stops when Cu reaches a predetermined height H1. In some embodiments, the height H1 ranges from about 400 Å to about 1000 Å, such as 620 Å in a specific example. Compared with TiN and W that have been widely used for forming bottom electrode via, Cu has a much smaller resistivity that is only about one tenth (1/10) of TiN and about one third (1/3) of W. By using Cu as a bottom portion of the bottom electrode via, the overall resistance of the bottom electrode via can be effectively reduced.

Figure 6:
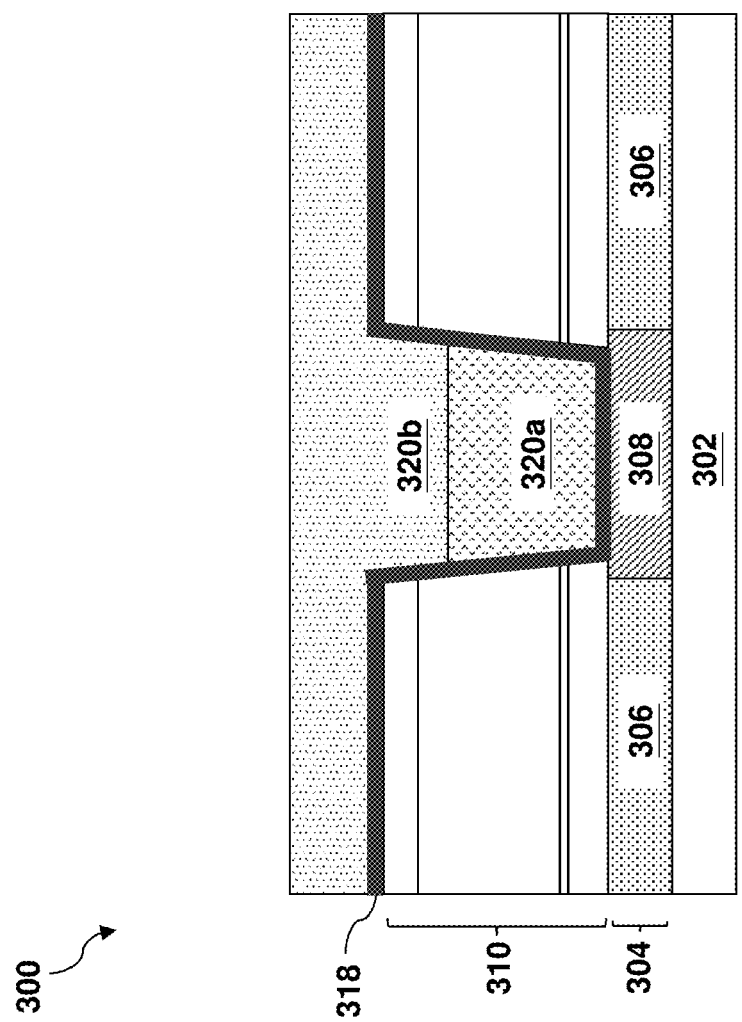
Figure 7:
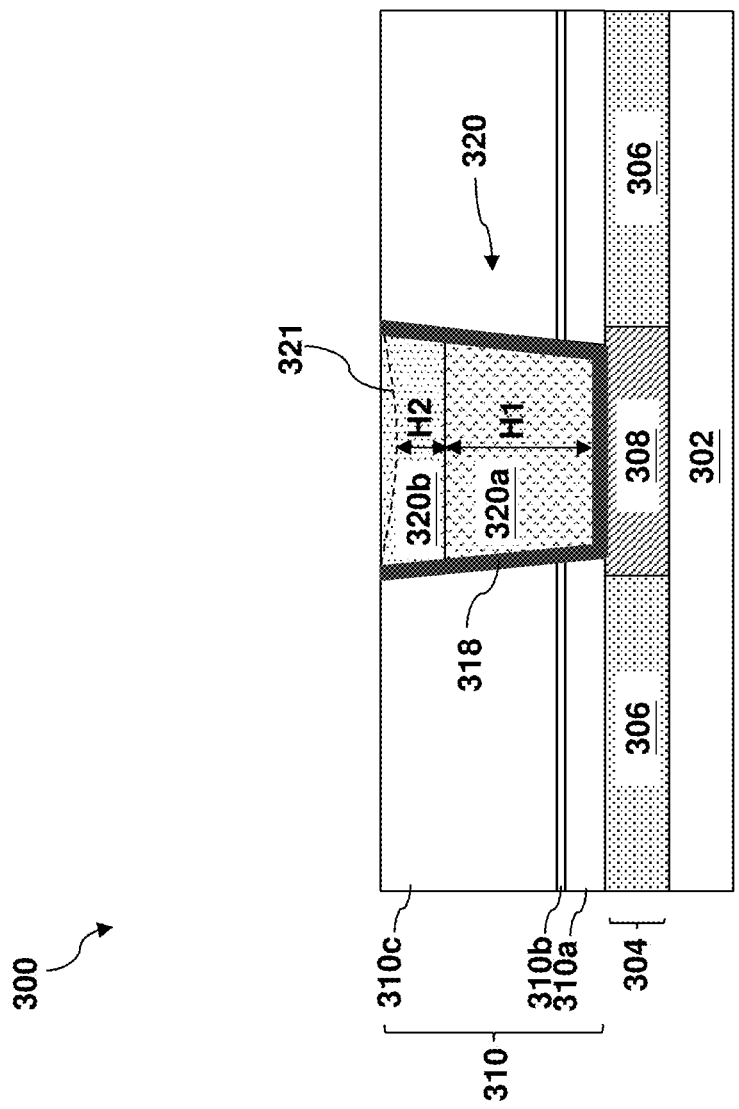

At operation 208, the method 200 (FIG. 2A) performs a second deposition of bottom electrode via material 320b in the via trench 316 and over the diffusion barrier layer 318, such as shown in FIG. 6. The bottom electrode via material 320b comprises a metal different from the bottom electrode material 320a. The second deposited bottom electrode via material 320b may be formed by a variety of techniques, such as high-density IMP deposition, high-density ICP deposition, sputtering, CVD, PVD, LP-CVD, PE-CVD, and the like. In the illustrated embodiment, the bottom electrode via material 320b is W and is formed in a Damascene operation followed by a planarization process, such as a chemical mechanical polishing (CMP), an eth operation, or combinations thereof, to remove excessive conductive material. The planarization process also removes the diffusion barrier layer 318 from locations outside the via trench 316 and thus exposes the top surface of the dielectric layer 310. The capping layer 310d in the top portion of the dielectric layer 310 may also be removed in the planarization process. The resultant structure after the planarization process is illustrated in FIG. 7. If the opening of the via trench 316 is wider than a predetermined value, a dishing effect may occur in the second deposited bottom electrode via material 320b as a result of planarization process. The dotted line 321 in FIG. 7 represents an alternative top surface of the second deposited bottom electrode via material 320b if a dishing effect occurs. The thickness H2 of the second deposited bottom electrode via material 320b is measured at its thinnest position, such as the bottommost point of the dotted line 321.

The first deposited bottom electrode via material 320a and the second deposited bottom electrode via material 320b collectively define a bottom electrode via 320. In other words, the bottom electrode via 320 includes a lower portion filled with a first conductive material 320a and an upper portion filled with a second conductive material 320b that is different from the first conductive material 320a. As discussed above, in the illustrated embodiment, the first conductive material 320a is Cu and the second conductive material 320b is W. Notably, the second conductive material 320b functions as a capping layer to block the diffusion of Cu into upper layers where a magnetic tunneling junction (MTJ) stack will subsequently be formed. Diffusion of Cu into the MTJ stack is detrimental to operations of MRAM cells. Therefore, in various embodiments, the thickness H2 of the conductive material 320b has a minimum thickness of about 120 Å. If the thickness H2 is smaller than 120 Å, the capping layer would not effectively block Cu diffusion. In some embodiments, the thickness H2 ranges from about 120 Å to about 300 Å, such as about 155 Å in a specific example. In some embodiments, a ratio between the thicknesses of Cu and W (H1/H2) ranges from about 2:1 to about 5:1, such as about 4:1 in a specific example. If H1/H2 is less than 2:1, the upper portion comprising W may be too thick and the resistance of the bottom electrode via may become too large and negatively impact MRAM cell performance. If H1/H2 is larger than 5:1, the W layer may be too thin to effectively block the diffusion of Cu and yet negatively impact MRAM cell performance. By having Cu as a major portion of the bottom electrode via without causing Cu diffusion into MTJ stacks, the resistance of the bottom electrode via can be reduced by about 60% to about 90% in some embodiments. Accordingly, the overall series resistance in the current path through the MRAM cell is also reduced. Further, the series resistance reduction method is easily compatible with back-end-of-line (BEOL) process flows, providing better MRAM operations with controlled manufacturing cost.

Figure 8:
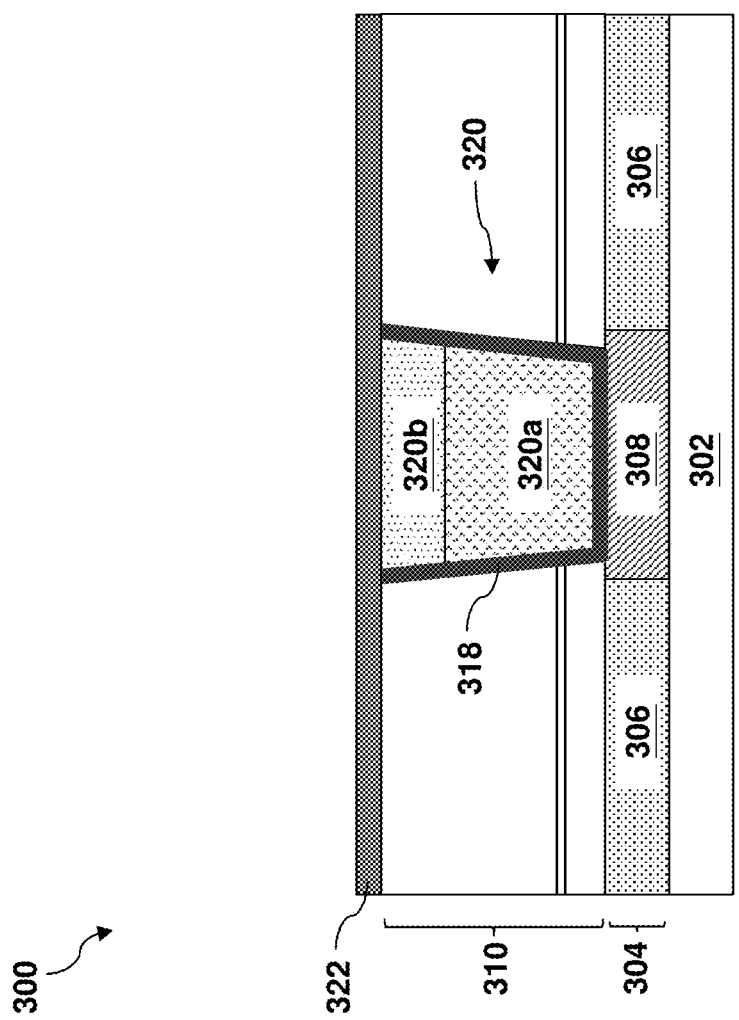

At operation 210, the method 200 (FIG. 2A) forms a bottom electrode layer 322 over the dielectric layer 310 and in contact with the bottom electrode via 320, such as shown in FIG. 8. The bottom electrode layer 322 may be a conductive material, such as, for example, TiN, TaN, Ti, Ta, or a combination of one or more of the foregoing. The bottom electrode layer 320 may be deposited through a process such as ALD, CVD, PVD or other suitable methods. For example, the bottom electrode layer 320 may be formed by depositing TiN in a PVD process at a temperature above 300 degrees in Celsius. The top surface of the bottom electrode layer 322 may have a non-planar top surface after deposition and may be planarized in one or more CMP processes thereafter. In some embodiments, the bottom electrode layer 322 has a thickness about 140-160 Å.

Figure 9:
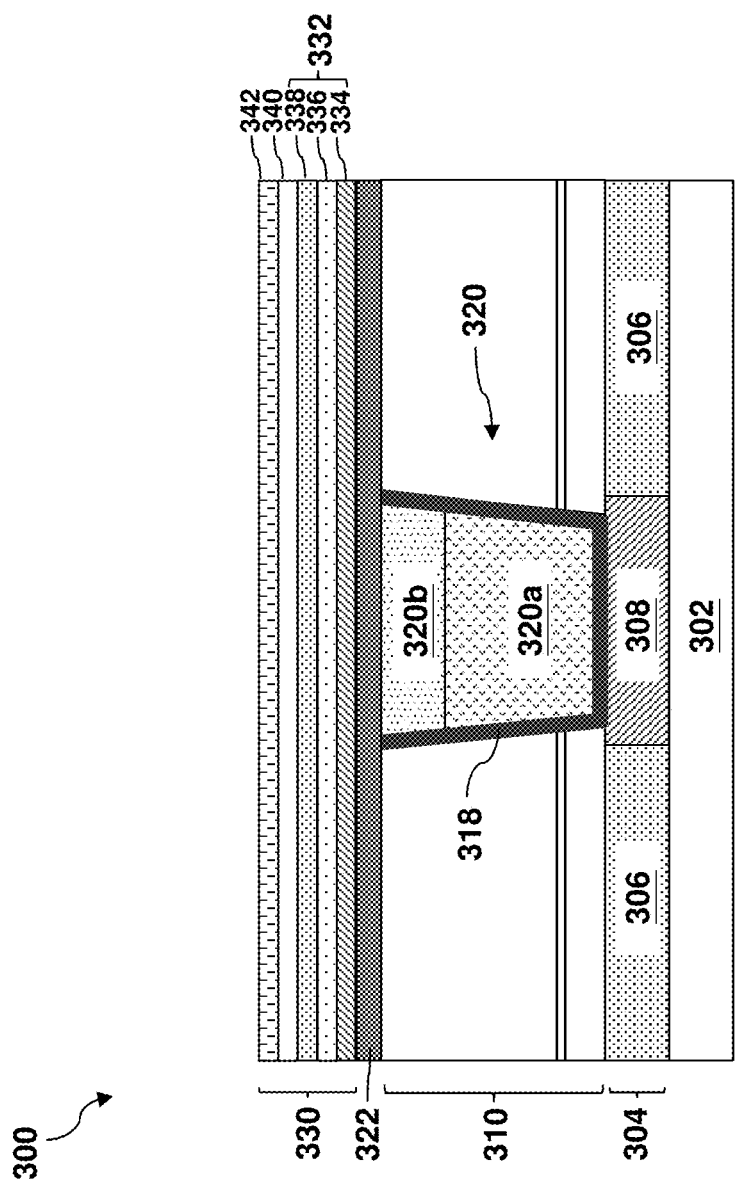

At operation 212, the method 200 (FIG. 2A) forms a magnetic tunneling junction (MTJ) stack 330 over an upper surface of the bottom electrode layer 322, such as shown in FIG. 9. In the illustrated embodiment, the MTJ stack 330 includes a lower ferromagnetic electrode layer 332 (which can have a pinned magnetic orientation) and an upper ferromagnetic electrode layer 342 (which can have a free magnetic orientation). A tunneling barrier layer 340 is disposed between the lower and upper ferromagnetic electrodes layers 332 and 342. The lower ferromagnetic electrode layer 332 can be a synthetic anti-ferromagnetic (SAF) structure that includes a bottom pinned ferromagnetic layer 334, a top pinned ferromagnetic layer 338, and a metal layer 336 sandwiched between the bottom and top pinned ferromagnetic layers 334 and 338. Each layer of the MTJ stack 330 is disposed through appropriate layer growth techniques. Some layer growth techniques comprise sputter deposition, molecular beam epitaxy (MBE), pulsed laser deposition (PLD), ALD, electron beam (e-beam) epitaxy, chemical CVD, or derivative CVD processes further comprising LP-CVD, atomic layer CVD (AL-CVD), ultrahigh vacuum CVD (UHV-CVD), reduced pressure CVD (RP-CVD), or any combinations thereof.

In some embodiments, the upper ferromagnetic electrode layer 342 comprises Fe, Co, Ni, FeCo, CoNi, CoFeB, FeB, FePt, FePd, or the like, and has a thickness ranging between approximately 8 Å and approximately 13 Å. In some embodiments, the tunneling barrier layer 340 provides electrical isolation between the upper ferromagnetic electrode layer 342 and the lower ferromagnetic electrode layer 332, while still allowing electrons to tunnel through the tunneling barrier layer 340 under proper conditions. The tunneling barrier layer 340 may comprise, for example, magnesium oxide (MgO), aluminum oxide (e.g., $Al_2O_3$), NiO, GdO, $Ta_2O_5$, $MoO_2$, $TiO_2$, $WO_2$, or the like. Further, the tunneling barrier layer 340 may be, for example, about 100-200 Å thick. In an embodiment, the bottom pinned ferromagnetic layer 334 includes a CoFeB film. Alternatively, the bottom pinned ferromagnetic layer 334 may comprise other materials, such as CoFeTa, NiFe, Co, CoFe, CoPt, CoPd, FePt, or an alloy of Ni, Co, and Fe. In an embodiment, the metal layer 336 includes ruthenium (Ru). Alternatively, the metal layer 336 may include other suitable material, such as Ti, Ta, Cu, or Ag. In some embodiments, the top pinned ferromagnetic layer 338 includes a ferromagnetic material substantially similar to that of the bottom pinned ferromagnetic layer 334. For example, the top pinned ferromagnetic layer 338 includes a CoFeB film. In various embodiments, the MTJ stack 330 has a total height in a range from about 200 Å to about 400 Å.

Figure 10:
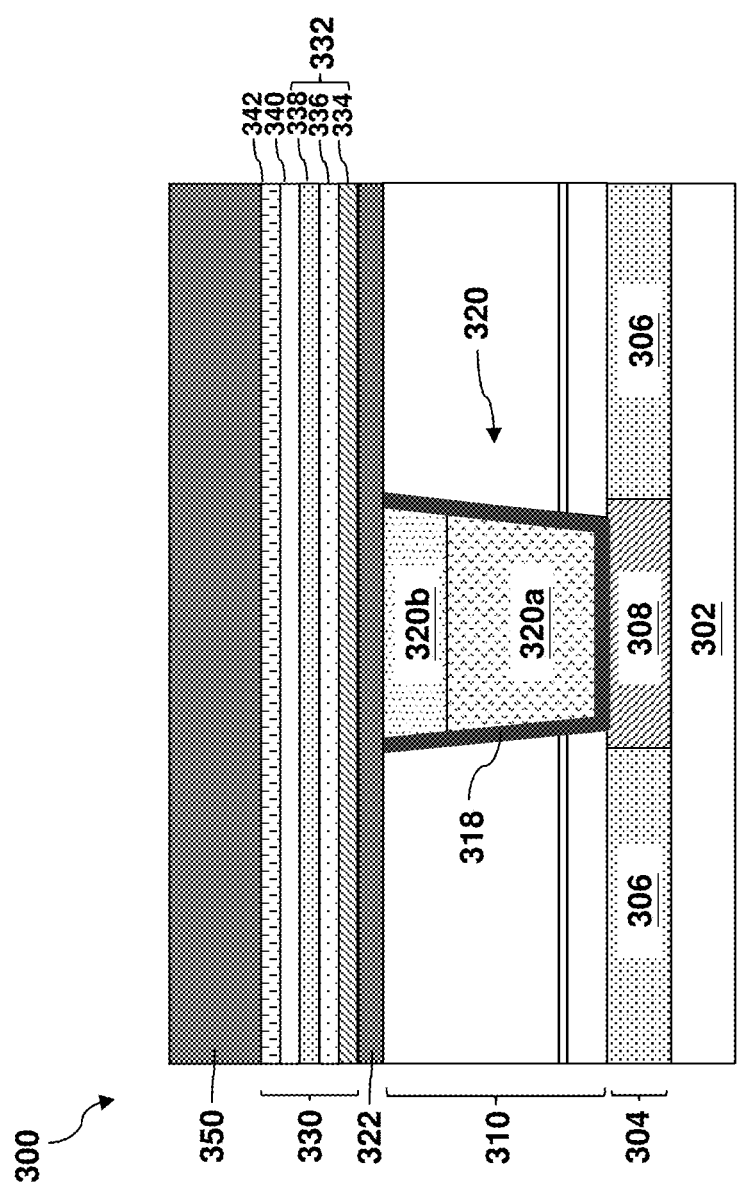

At operation 214, the method 200 (FIG. 2B) forms a top electrode layer 350 over an upper surface of the MTJ stack 330, such as shown in FIG. 10. The top electrode layer 350 may be a conductive material, such as, for example, TiN, TaN, Ti, Ta, or a combination of one or more of the foregoing. The top electrode layer 350 may be deposited through a process such as ALD, CVD, PVD or other suitable methods. For example, the top electrode layer 350 may be formed by depositing TiN in a PVD process at a temperature above 300 degrees in Celsius. The top surface of the top electrode layer 350 may have a non-planar top surface after deposition and may be planarized in one or more CMP processes thereafter. In some embodiments, the bottom electrode layer 322 and the top electrode layer 350 include different conductive material, such as Ta, TaN, or a combination of Ta and TaN in the bottom electrode layer 322, whereas TiN in the top electrode layer 350. In some embodiments, the top electrode layer 350 has a thickness about 250-300 Å. In the illustrated embodiment, the top electrode layer 350 has a larger thickness than the bottom electrode layer 322.

Figure 11:
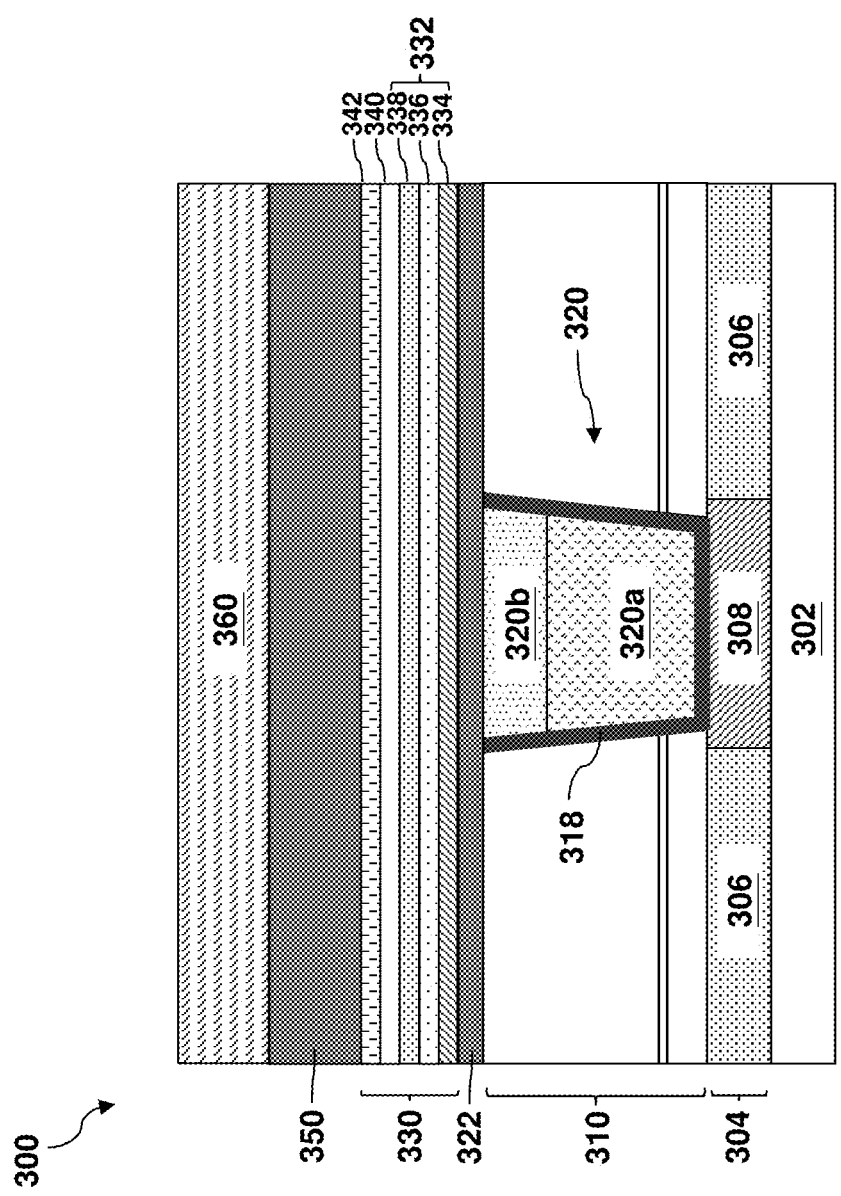
Figure 12:
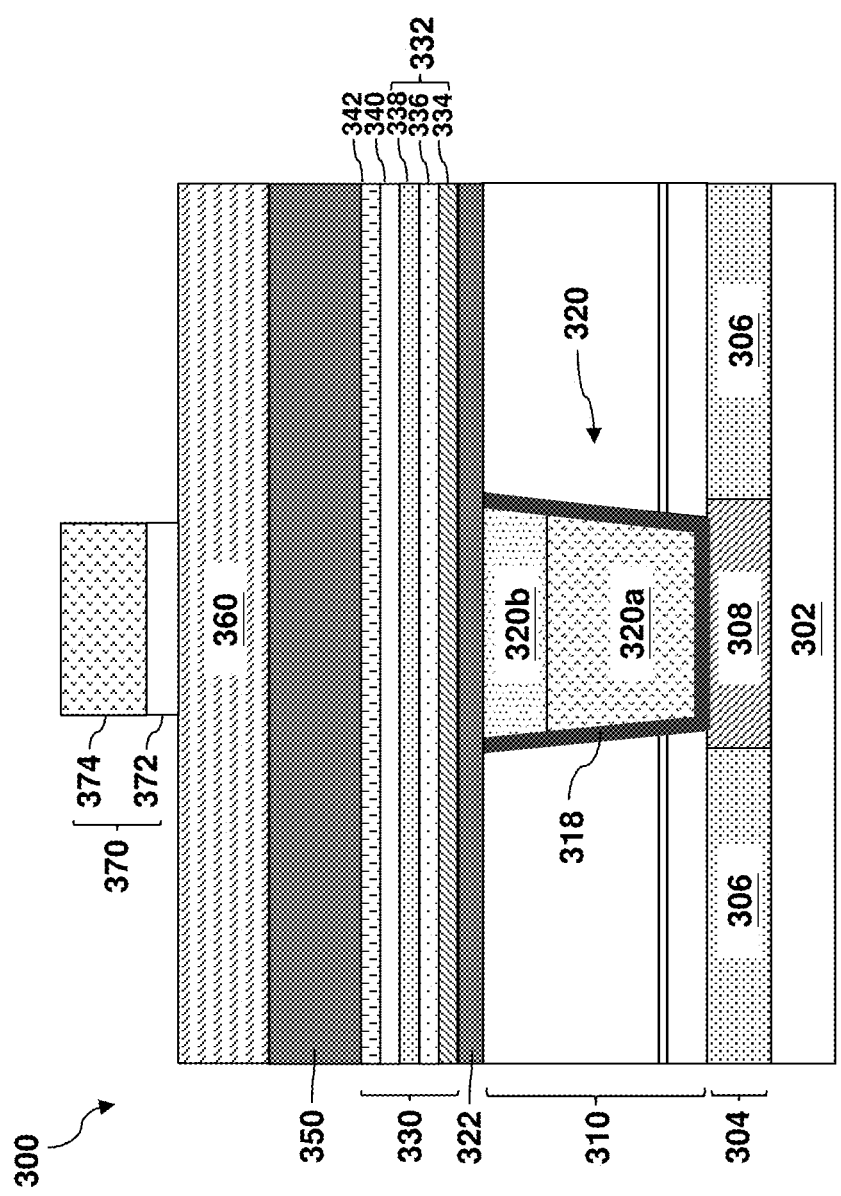
Figure 13:
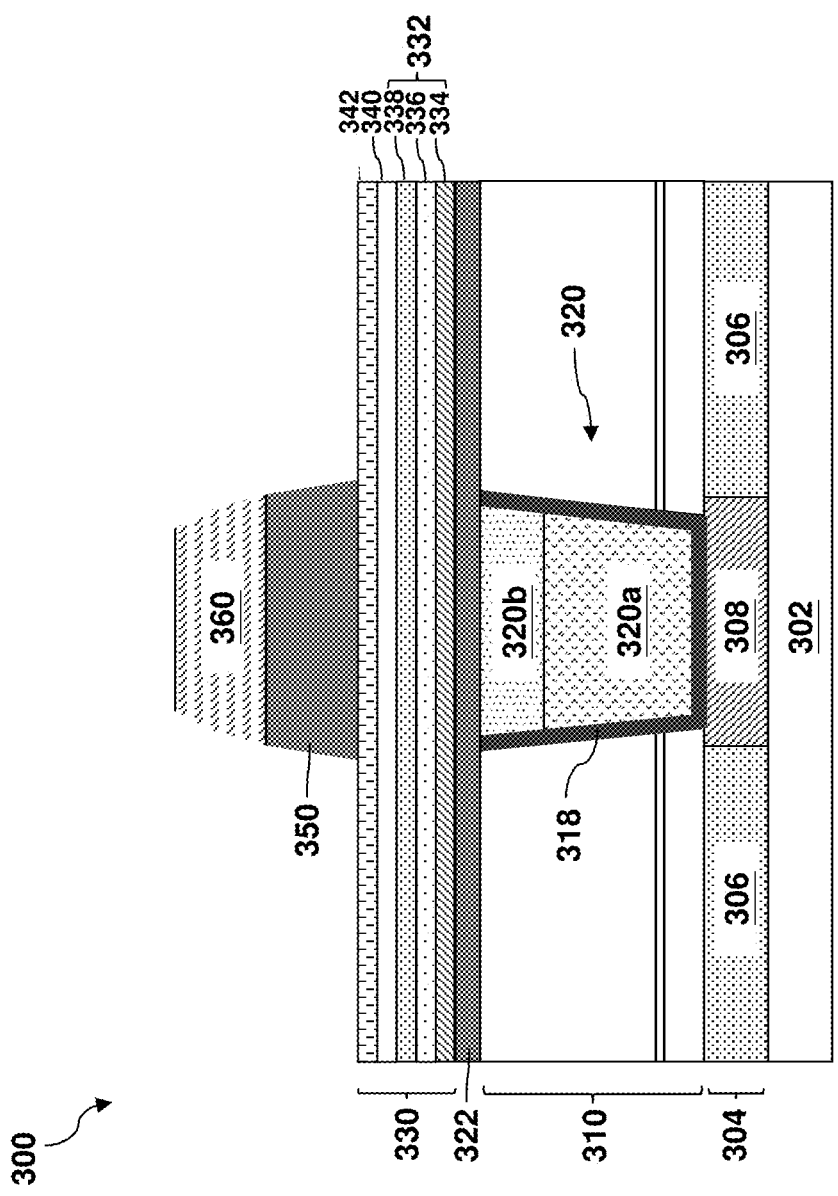

At operation 216, the method 200 (FIG. 2B) forms a hard mask layer 360 over the top electrode layer 350, such as shown in FIG. 11. The hard mask layer 360 may include one or more patterning layers. In some embodiments, the hard mask layer 360 comprises dielectric material such as silicon oxide, silicon nitride, silicon oxynitride, amorphous carbon (APF), or suitable combination thereof. The hard mask layer 360 may be deposited through a process such as CVD or other suitable methods. Operation 216 further includes patterning the hard mask layer 360 by photolithography and etching processes, such as shown in FIGS. 12 and 13. The photolithography and etching processes may first form and pattern a resist layer 370 over the hard mask layer 360, then pattern the hard mask layer 360 using the patterned resist layer 370 as an etching mask. The resist layer 370 may include two or more layers, such as a bottom anti-reflective coating (BARC) layer 372 and a photosensitive layer 374 in the illustrated embodiment. An exemplary photolithography process may include a lithographic exposure to perform on the photosensitive layer 374 that exposes selected regions to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, a pattern formed in the photosensitive layer 374 is transferred to the BARC layer 372 by selectively etching through openings in the developed photosensitive layer 374, resulting in a patterned resist layer 370. Subsequently, such as shown in FIG. 13, the exposed portions of the hard mask layer 360 may be removed by an etching process 376, such as wet etching, dry etching, Reactive Ion Etching (RIE), ashing, and/or other etching methods, resulting in a patterned hard mask layer 360. The patterned hard mask layer 360 may be in a form of a pillar with a circular shape from a top view. The shape of the patterned hard mask layer 360 will be transferred to the top electrode layer 350 and the underlying MTJ stack 330 by patterning methods disclosed in subsequent embodiments herein. After patterning the hard mask layer 360, the resist layer 370 may be removed.

At operation 218, the method 200 (FIG. 2B) etches the top electrode layer 350 using the patterned hard mask layer 360 as an etching mask, such as shown in FIG. 13. Operation 218 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In some embodiments, the etching process is an RIE process under process parameters such as a source power ranging from about 900 W to about 1200 W, a bias voltage ranging from about 0 V to about 500 V, a gas flow ranging from about 10 sccm to about 200 sccm, and a temperature ranging from about 15 degrees in Celsius to about 55 degrees in Celsius. The etchant gas may include $Cl_2$, $SiCl_4$, $BCl_3$, $NF_3$, $N_2$, $H_2$, $CH_4$, HBr, He, Ar, or a combination thereof. After etching the top electrode layer 350, the patterned hard mask layer 360 may be removed.

Figure 14:
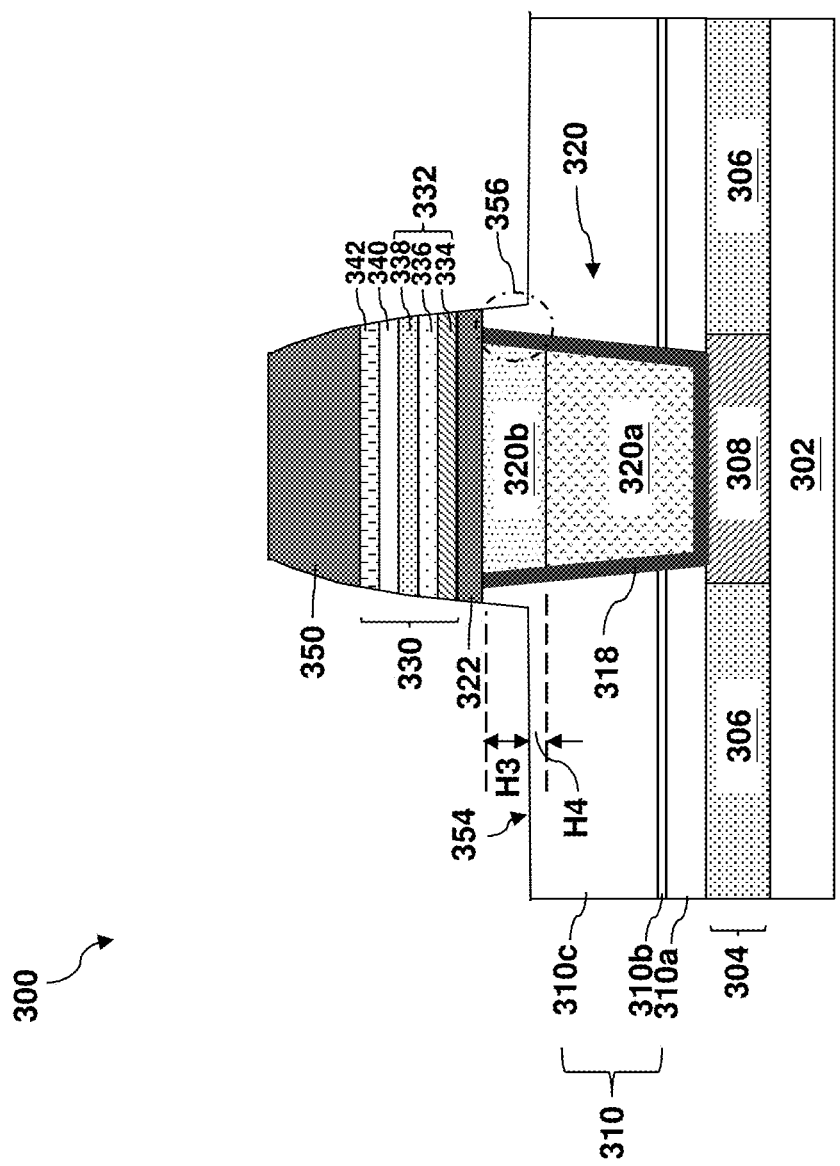

At operation 220, the method 200 (FIG. 2B) etches the MTJ stack 330 and the bottom electrode layer 322 using the patterned top electrode layer 350 as an etching mask, such as shown in FIG. 14. Operation 220 includes an etching process to etch through the MTJ stack 330 and the bottom electrode layer 322. In an embodiment, the etching process is an isotropic dry etching process. In some embodiments, the etching process transfers a pattern defined in the top electrode layer 350 such as a pillar array (e.g., cylindrical pattern) into the MTJ stack 330 first, followed by the removal of portions of the bottom electrode layer 322 using the patterned top electrode layers 350 and the patterned MTJ stack 330 together as an etching mask. In some embodiments, the etching process etches the MTJ stack 330 and the lower electrode layer 322 together with no intermediate etching step. In some embodiments, the etching process in operation 218 and the etching process in operation 220 are one etching step, which etches the top electrode layer 350, the MTJ stack 330, and the bottom electrode layer 322 together with no intermediate etching step. After patterning the top electrode layer 350, the MTJ stack 330, and the bottom electrode layer 320, for the sake of simplicity of description, the patterned top electrode layer 350 is denoted as the top electrode 350, the patterned MTJ stack 330 is denoted as the MTJ 330, and the patterned bottom electrode layer 322 is denoted as the bottom electrode 322.

In some embodiments, the etching process comprises applying a wet etchant or a plasma etchant for a predetermined period of time. In some embodiments, operation 220 uses an end-point control method to precisely control the etching time. An end-point control analyzes emitted residuals in real time during an etching process, such as by inspecting light spectra emitted by a plasma during a plasma etching with an optical emission spectroscopy (OES). When material compositions from the bottom electrode 322 diminish, the etching process slightly over etches into a top portion of the dielectric layer 310, such that the top surface 354 of the USG layer 310c is below the bottom surface of the bottom electrode 322 for a distance H3. In one example, the distance H3 is about 100 Å. In some embodiment, In the illustrated embodiment, the bottom electrode 322 is wider than a top surface of the bottom electrode via 320, and a portion of the USG layer 310c remains directly under the bottom electrode 322, as highlighted in the dotted circle 356 in FIG. 14. Notably, the over etch keeps the top surface 354 above an interface between W/Cu of the bottom electrode via 320 for a distance H4. In various embodiments, the distance H4 is at least 30 nm. If the distance H4 is less than 30 Å, it runs the risk of Cu diffusing into the fabrication apparatus and causing Cu contamination. In some embodiments, a ratio of the H3/H4 is about 0.5:1 to about 4:1. If H3/H4 is less than 0.5:1, the over etch may not be sufficient to ensure the complete patterning of the bottom electrode layer 322 under various process variations. If H3/H4 is larger than 4:1, there is high risk of Cu leaking and contamination.

Figure 15:
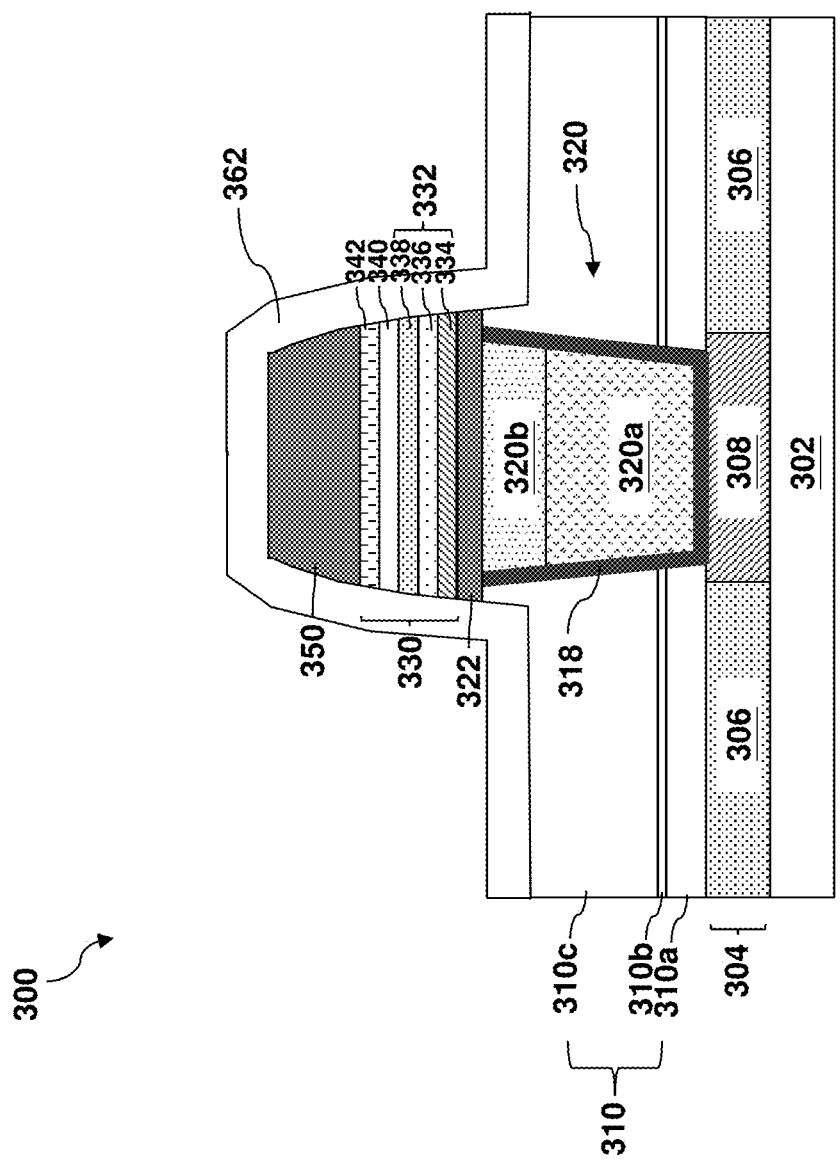
Figure 16:
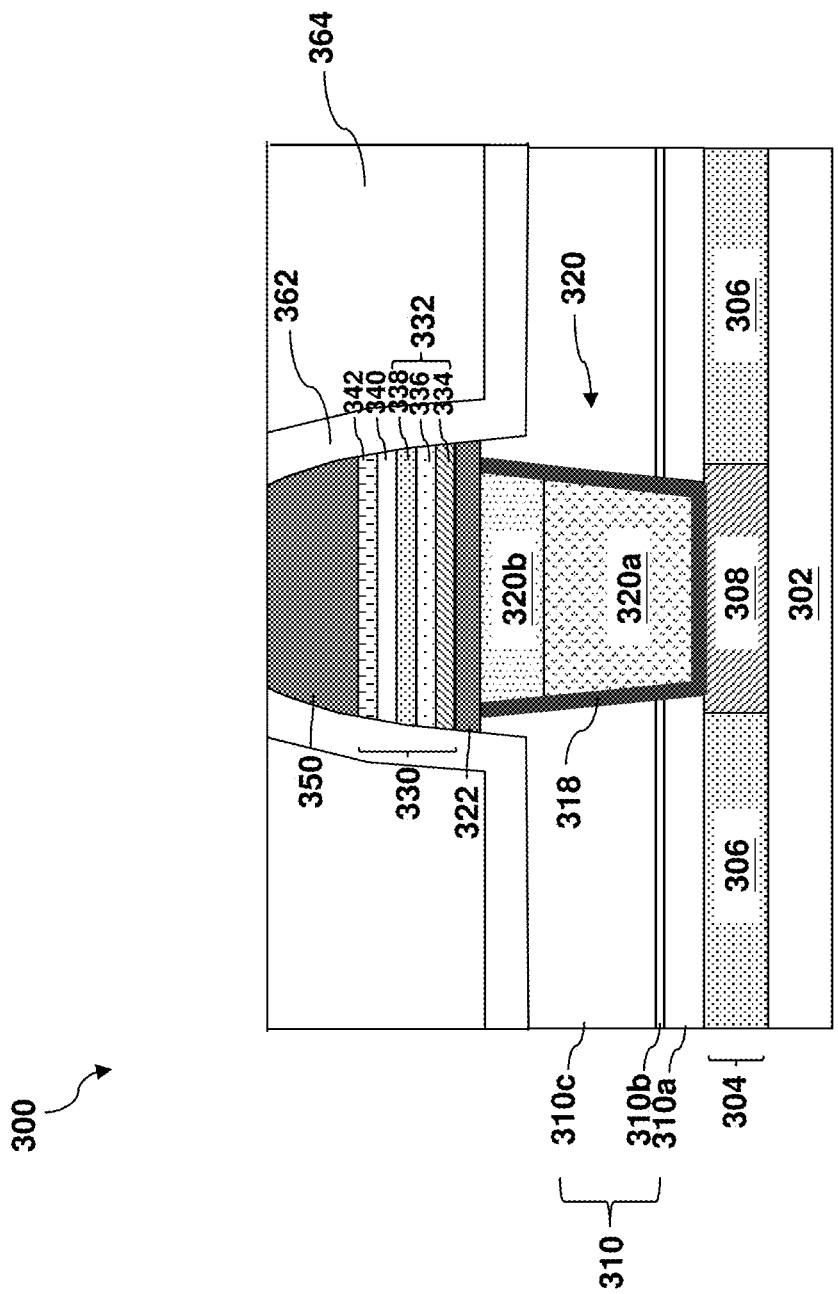

At operation 222, the method 200 (FIG. 2B) forms a sidewall spacer layer 362 covering sidewalls of the top electrode 350, the MTJ 330, and the bottom electrode 320, as well as the top surface of the top electrode 350 and the dielectric layer 310, such as shown in FIG. 15. The sidewall spacer layer 362 may comprise a dielectric material, such as silicon oxide, silicon nitride, silicon oxynitride, silicon carbide, other dielectric material, or combinations thereof, and may comprise one or multiple layers of material. The sidewall spacer 362 may be formed by depositing a spacer material as a blanket layer over the device structure 300. Subsequently, a dielectric layer 364, such as a tetraethyl orthosilicate (TEOS) layer, is deposited over the sidewall spacer layer 362. The dielectric layer 364 may be formed by PE-CVD, flowable chemical vapor deposition (F-CVD), or other suitable methods. A planarization operation is then performed on the dielectric layer 364 and the sidewall spacer layer 362 such that the top surface of the top electrode 350 is exposed after the planarization operation. The resultant structure after the planarization operation is shown in FIG. 16. Due to the recessed top surface of the dielectric layer 310, a portion of the sidewall spacer layer 362 is below the bottom surface of the bottom electrode 322.

Figure 17:
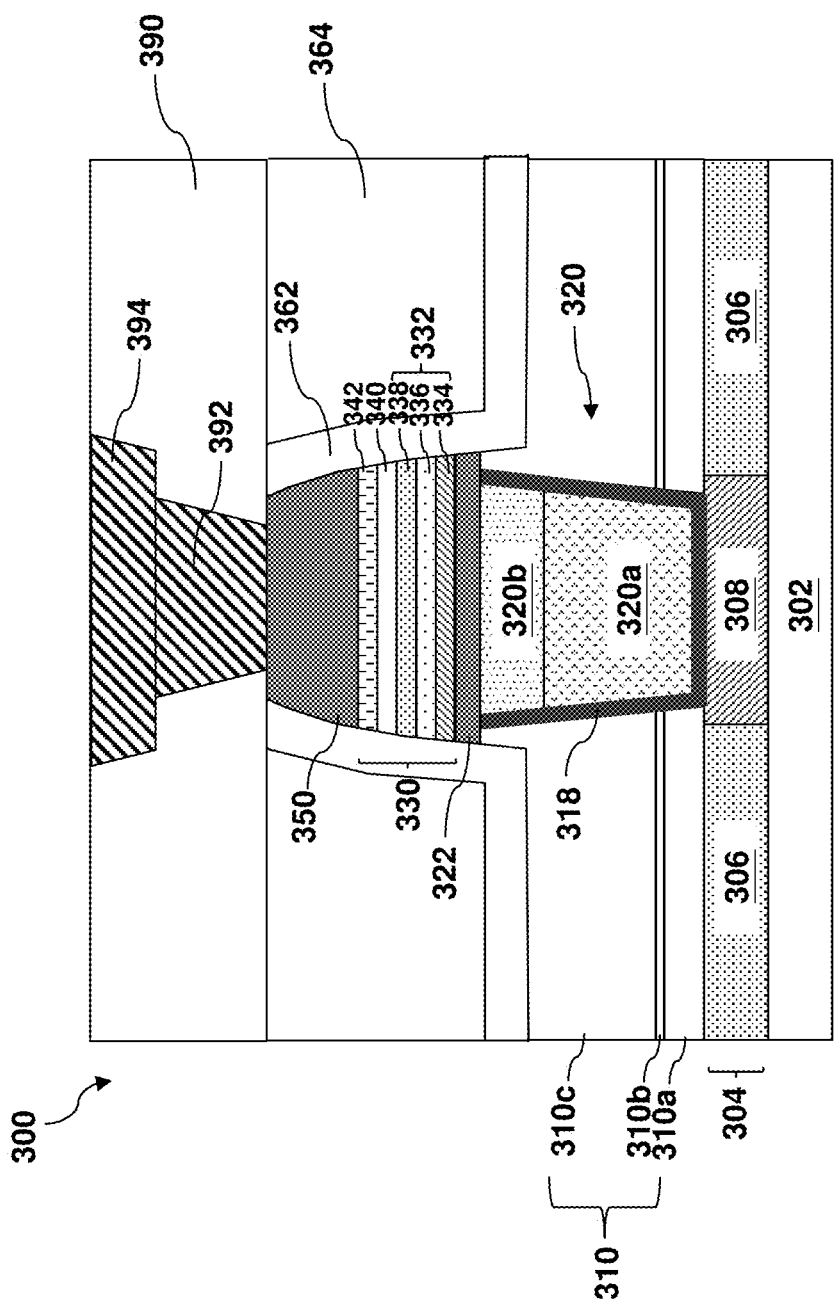

At operation 224, the method 200 (FIG. 2B) forms an inter-metal dielectric (IMD) layer 390 covering the sidewall spacer layer 362 and the dielectric layer 364, such as shown in FIG. 17. The IMD layer 390 may comprise tetraethyl orthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The IMD layer 390 may be formed by PE-CVD, F-CVD, or other suitable methods. In some embodiments, the IMD layer 396 is formed of a low-k dielectric layer or an extreme low-k dielectric layer, to a thickness of approximately 2500 Å. If an extreme low-k dielectric layer is used, a curing process may be followed after depositing the extreme low-k dielectric layer to increase its porosity, lower the k value, and improve the mechanical strengths. The operation 224 also performs one or more CMP processes to planarize the top surface of the device structure 300.

At operation 226, the method 200 (FIG. 2B) performs further steps to complete the fabrication of the device structure 300. For example, the method 200 may form a via trench and an opening (not shown) in the IMD layer 396 and deposit conductive materials therein to provide interconnections, such as the metal line 394 and the top electrode via (TEVA) 392 that lands on the top electrode 350, such as shown in FIG. 17. The metal line 394 is part of a metallic interconnection layer, such as a bit line (e.g., bit line $BL_1$ in FIG. 1C) in an MRAM cell array. The top electrode via 392 electrically connects an MRAM cell to the metallic interconnection layer. In some embodiments, the top electrode via 392 and the metal line 394 comprise Cu or W. The top electrode via 392 and the metal line 394 can be formed by a damascene or dual-damascene process.

Figure 18:
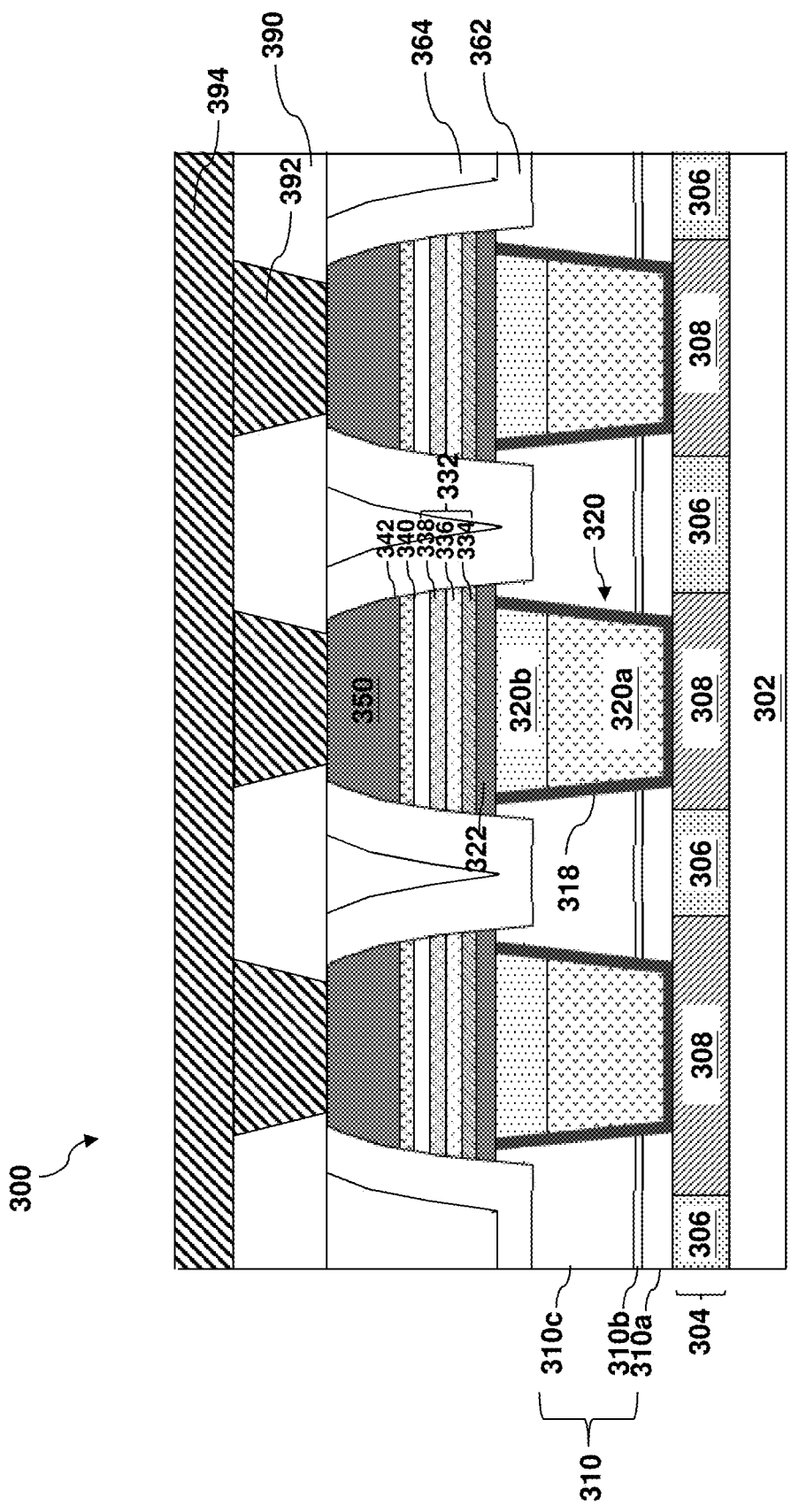

FIG. 18 illustrates a cross-sectional view of the MRAM cell array in FIG. 1C along the A-A line. In FIG. 18, a plurality of MRAM cells are deposited sequentially along a bit line (e.g., the bit line $BL_1$ in FIG. 1C). The top electrode via 392 and metal line 394 form a continuous conductive body extending above the MRAM cells. The metal lines 308 embedded in the IMD layer 306 form word lines (e.g., the word lines WL1-WLM in FIG. 1C). The bottom electrode 322 is discontinued between two adjacent MRAM cells to avoid shorting different word lines. Take data reading operation as an example, to read data from a MRAM cell, a voltage bias is applied between a metal line 394 and a metal line 308 to select a particular MRAM cell. Driven by the bias, a current flows through a combined structure of the metal line 394, the top electrode via 392, the top electrode 350, the MTJ 332, the bottom electrode 322, the bottom electrode via 320, and the metal line 308. One can thus obtain a series resistance of the combined structure from values of the bias and the driven current and further derive the resistance of the MTJ 332. By fabricating MRAM cells with low-resistive copper-containing bottom electrode vias 320, the additional resistance other than the resistance of the MTJ 332 in the current path is reduced, which increases sensitivity and speed of the MRAM cells.

Although not intended to be limiting, one or more embodiments of the present disclosure provide many benefits to a semiconductor device and the formation thereof. For example, embodiments of the present disclosure provide an MRAM cell array with low-resistive copper-containing bottom electrode vias in achieving high sensitivity and high speed of the MRAM cell array without risking copper diffusion into MTJs. Furthermore, formation of the MRAM cell array can be easily integrated into existing semiconductor fabrication processes.

In one exemplary aspect, the present disclosure is directed to a method for manufacturing a memory device. The method includes a method for manufacturing a memory device. The method includes forming a via trench in a substrate; forming a via in the via trench, wherein a lower portion of the via includes a first metal and an upper portion of the via includes a second metal that is different from the first metal; forming a magnetic tunneling junction over the via; and forming a top electrode over the magnetic tunneling junction. In some embodiments, the first metal has a lower resistivity than the second metal. In some embodiments, the first metal has a first thickness and the second metal has a second thickness that is smaller than the first thickness. In some embodiments, a ratio of the first thickness over the second thickness ranges from about 2:1 to about 5:1. In some embodiments, the second thickness is not less than about 120 Å. In some embodiments, the first metal is copper and the second metal is tungsten. In some embodiments, the method further includes prior to the forming of the via, depositing a diffusion barrier layer in the via trench. In some embodiments, the method further includes prior to the forming of the magnetic tunneling junction, forming a bottom electrode over the via. In some embodiments, the method further includes recessing a top surface of the substrate, wherein the recessed top surface of the substrate remains above an interface between the first metal and the second metal. In some embodiments, the recessed top surface is above the interface for at least 30 Å.

In another exemplary aspect, the present disclosure is directed to a method of forming a memory device. The method includes providing a substrate; forming a via trench in the substrate; depositing a first metal in a lower portion of the via trench; depositing a second metal in an upper portion of the via trench, thereby forming a via in the via trench, wherein the second metal has a higher resistivity than the first metal; forming a bottom electrode layer over the via; forming a magnetic tunneling junction stack over the bottom electrode layer, wherein the magnetic tunneling junction stack includes a lower ferromagnetic layer, a tunneling barrier layer over the lower ferromagnetic layer, and an upper ferromagnetic layer over the tunneling barrier layer; and forming a top electrode layer over the magnetic tunneling junction stack. In some embodiments, the first metal is copper and the second metal is tungsten. In some embodiments, a thickness of the second metal is smaller than that of the first metal. In some embodiments, the thickness of the second metal is at least 120 Å. In some embodiments, the method further includes forming a mask layer over the top electrode layer; patterning the mask layer; and etching the top electrode layer, the magnetic tunneling junction stack, and the bottom electrode layer using the patterned mask layer as an etch mask. In some embodiments, the etching of the bottom electrode layer includes over etching a top portion of the substrate, such that a top surface of the substrate is below a bottom surface of the bottom electrode layer but above a topmost portion of the first metal in the via trench.

In yet another exemplary aspect, the present disclosure is directed to a memory device. The memory device includes a bottom electrode via including a lower portion and an upper portion, wherein the lower portion includes a first metal and the upper portion includes a second metal that is different than the first metal; a bottom electrode disposed over the bottom electrode via; a magnetic tunneling junction disposed over the bottom electrode; and a top electrode disposed over the magnetic tunneling junction. In some embodiments, the first metal has a lower resistivity than the second metal. In some embodiments, the first metal is copper and the second metal is tungsten. In some embodiments, the memory device further includes a dielectric layer surrounding the bottom electrode via, wherein a portion of the dielectric layer is directly under and in contact with the bottom electrode.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   forming a via trench in a substrate;
   forming a via in the via trench, wherein a lower portion of the via includes a first metal and an upper portion of the via includes a second metal that is different from the first metal;
   after the forming of the via, forming a bottom electrode on a to surface of the via;
   forming a magnetic tunneling junction on a top surface of the bottom electrode; and
   forming a top electrode over the magnetic tunneling junction.

2. The method of claim 1, wherein the first metal has a lower resistivity than the second metal.

3. The method of claim 1, wherein the first metal has a first thickness and the second metal has a second thickness that is smaller than the first thickness.

4. The method of claim 3, wherein a ratio of the first thickness over the second thickness ranges from about 2:1 to about 5:1.

5. The method of claim 3, wherein the second thickness is not less than about 120 Å.

6. The method of claim 1, wherein the first metal is copper and the second metal is tungsten.

7. The method of claim 1, further comprising:
   prior to the forming of the via, depositing a diffusion barrier layer in the via trench.

8. The method of claim 1, further comprising:
recessing a top surface of the substrate, wherein the recessed top surface of the substrate remains above an interface between the first metal and the second metal.

9. The method of claim 8, wherein the recessed top surface is above the interface for at least 30 Å.

10. A method of forming a memory device, comprising:
providing a substrate;
forming a via trench in the substrate;
depositing a first metal in a lower portion of the via trench;
depositing a second metal in an upper portion of the via trench, thereby forming a via in the via trench, wherein the second metal has a higher resistivity than the first metal;
forming a bottom electrode layer over the via;
forming a magnetic tunneling junction stack over the bottom electrode layer, wherein the magnetic tunneling junction stack includes a lower ferromagnetic layer, a tunneling barrier layer over the lower ferromagnetic layer, and an upper ferromagnetic layer over the tunneling barrier layer; and
forming a top electrode layer over the magnetic tunneling junction stack.

11. The method of claim 10, wherein the first metal is copper and the second metal is tungsten.

12. The method of claim 10, wherein a thickness of the second metal is smaller than that of the first metal.

13. The method of claim 12, wherein the thickness of the second metal is at least 120 Å.

14. The method of claim 10, further comprising:
forming a mask layer over the top electrode layer;
patterning the mask layer; and
etching the top electrode layer, the magnetic tunneling junction stack, and the bottom electrode layer using the patterned mask layer as an etch mask.

15. The method of claim 14, wherein the etching of the bottom electrode layer includes over etching a top portion of the substrate, such that a top surface of the substrate is below a bottom surface of the bottom electrode layer but above a topmost portion of the first metal in the via trench.

16. A method, comprising:
providing a substrate;
forming a dielectric layer over the substrate;
patterning the dielectric layer to form a trench exposing a top surface of the substrate;
depositing a barrier layer on sidewalls of the trench and on the top surface of the substrate;
depositing a first metal layer in a lower portion of the trench, wherein the first metal layer is essentially of copper;
depositing a second metal layer in an upper portion of the trench, wherein the second metal layer is essentially of tungsten, wherein the barrier layer is in physical contact with sidewalls of the first metal layer and sidewalls of the second metal layer;
forming a magnetic tunneling junction stack on the second metal layer; and
forming a top electrode layer over the magnetic tunneling junction stack.

17. The method of claim 16, wherein the depositing of the first metal layer includes a first metal deposition process, and the depositing of the second metal layer includes a second metal deposition process that is different from the first metal deposition process.

18. The method of claim 17, wherein the first metal deposition process is an electroplating process, and the second metal deposition process is a Damascene process.

19. The method of claim 16, wherein the first metal layer has a thickness larger than the second metal layer.

20. The method of claim 7, wherein the diffusion barrier layer covers sidewalls of the upper portion of the via.

* * * * *